(12) United States Patent
Tojima

(10) Patent No.: US 6,836,122 B2
(45) Date of Patent: Dec. 28, 2004

(54) DETERIORATION DEGREE CALCULATING APPARATUS AND DETERIORATION DEGREE CALCULATING METHOD FOR A BATTERY

(75) Inventor: Kazuo Tojima, Toyota (JP)

(73) Assignee: Toyota Jidosha Kabushiki Kaisha, Toyota (JP)

(*) Notice: Subject to any disclaimer, the term of this patent is extended or adjusted under 35 U.S.C. 154(b) by 75 days.

(21) Appl. No.: 10/438,873

(22) Filed: May 16, 2003

(65) Prior Publication Data

US 2003/0231006 A1 Dec. 18, 2003

(30) Foreign Application Priority Data

Jun. 12, 2002 (JP) ........................... 2002-171247

(51) Int. Cl.$^7$ ............................................. G01N 27/416
(52) U.S. Cl. ................................................ 324/426
(58) Field of Search ............................... 324/426–433; 320/132, 134; 702/63

(56) References Cited

U.S. PATENT DOCUMENTS 5,321,627 A * 6/1994 Reher ........................... 702/63
5,451,881 A * 9/1995 Finger .......................... 324/433
5,598,088 A * 1/1997 Richter ......................... 320/134

FOREIGN PATENT DOCUMENTS

| DE | 195 40 827 A1 | 5/1996 |
| DE | 199 52 693 A1 | 5/2001 |
| EP | 0 560 468 B1 | 9/1993 |
| JP | 5-74501 A | 3/1993 |
| JP | 52-145734 A | 12/1997 |
| JP | 10-224998 A | 8/1998 |
| JP | 11-282522 A | 10/1999 |

* cited by examiner

Primary Examiner—Pia Tibbits
(74) Attorney, Agent, or Firm—Kenyon & Kenyon

(57) ABSTRACT

A battery ECU includes a central processing unit (CPU). The CPU calculates plural deterioration degrees based on data input from a thermistor, an ammeter, and a voltmeter which detect state quantities of a nickel-hydrogen battery, and reads, from a memory, contribution degrees each of which corresponds to each of the calculated plural deterioration degrees. Then the CPU calculates a total deterioration degree of the nickel-hydrogen battery based on the deterioration degrees and the contribution degrees, calculates the contribution degrees based on the calculated total deterioration degree, and stores the contribution degrees in the memory.

19 Claims, 9 Drawing Sheets

F I G . 4
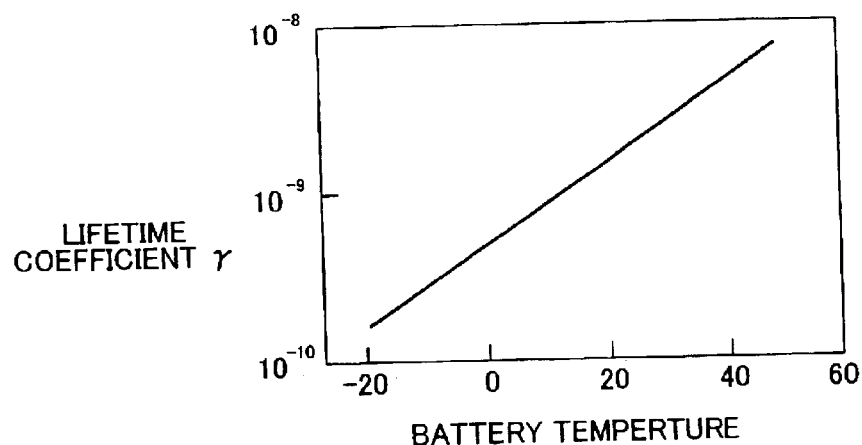
F I G . 5
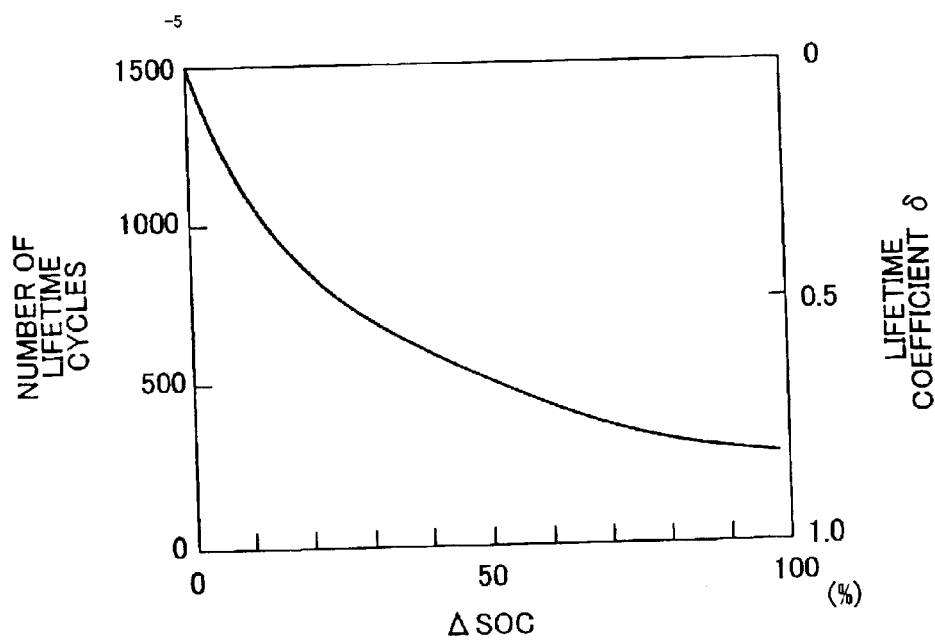

DETERIORATION DEGREE CALCULATING APPARATUS AND DETERIORATION DEGREE CALCULATING METHOD FOR A BATTERY

INCORPORATION BY REFERENCE

The disclosure of Japanese Patent Application No. 2002-171247 filed on Jun. 12, 2002, including its specification, drawings and abstract, is incorporated herein by reference in its entirety.

BACKGROUND OF THE INVENTION

1. Field of the Invention

The invention relates to a technology for calculating a deterioration degree of a battery which deteriorates while being used. More particularly, the invention relates to a deterioration degree calculating apparatus and a deterioration degree calculating method for a secondary battery mounted in a vehicle.

2. Description of the Related Art

Recently, a vehicle has been developed, which is provided with a power train using two types of power sources, that is, a gasoline engine that is an internal combustion engine and an electric motor. Such a power train is referred to as a hybrid system. The electric motor is driven by electric power supplied from a battery mounted in the vehicle. For example, when an alternating current motor is used as the electric motor, direct current electric power output from the battery is converted to alternating current electric power by a circuit such as an inverter, and the electric motor is driven by the alternating current electric power.

The battery used in such a hybrid system needs to be reliable because it relates to running of the vehicle. The deterioration degree of the battery depends on the state of use, as well as elapsed years after the start of use. Therefore, it is difficult to determine the deterioration degree of the battery based only on elapsed years after the start of use.

Japanese Patent Laid-Open Publication No. 52-145734 discloses a method of determining a lifetime of such a secondary battery. The method of determining a lifetime of a secondary battery disclosed in the patent publication includes the steps of measuring elapsed years after the start of use, external appearance, variations in cell voltage at the time of floating charge or equalizing charge, charging current, variations in specific gravity of electrolyte, electrostatic capacity at the time of floating charge, and internal resistance which are factors closely correlated with aged deterioration of the secondary battery; ranking the results of the determination; and determining a lifetime and a residual lifetime of the battery based on the total score obtained by summing each score set for each rank of each factor.

According to the method of determining a lifetime of a battery disclosed in the aforementioned patent publication, quantity states of various factors concerning the secondary battery are measured. With regard to each of factors closely correlated with the deterioration of the battery, the degree of the influence on the deterioration state of the secondary battery is classified as, for example, one of four ranks based on the range of a measured value. A score is set for each rank, and the rank is calculated based on the measured value. The lifetime of the secondary battery is determined based on the total score obtained by summing each score set for each rank of each factor.

In the method of determining a lifetime of a battery disclosed in the aforementioned patent publication, for example, a skilled person performs ranking and sets a score corresponding to each rank for calculating the total score, based on the skilled person's experience. As disclosed in the aforementioned patent publication, there are various factors concerning the lifetime of the secondary battery, and the lifetime of the secondary battery is determined using the fixed ranks and scores for the various factors. Therefore, the lifetime of the secondary battery cannot be accurately determined.

SUMMARY OF THE INVENTION

It is an object of the invention to provide a deterioration degree calculating apparatus and a deterioration degree calculating method for a battery which can accurately determine a lifetime of a battery and can generate information based on the lifetime.

A deterioration degree calculating apparatus according to a first aspect of the invention includes a detector that detects plural state quantities of a battery; a processor that calculates plural deterioration degrees based on the detected plural state quantities; a storing device that stores contribution degrees each of which corresponds to each of the deterioration degrees; the processor calculating a total deterioration degree based on the deterioration degrees and the contribution degrees; and the processor calculating the contribution degrees.

According to the first aspect of the invention, the detector detects, for example, a temperature of a secondary battery, a charging/discharging current value of the battery, a quantity of change in a state of charge (SOC) of the battery. The processor calculates, for example, a deterioration degree of the battery based on the temperature of the battery, a deterioration degree of the battery based on the charging/discharging current value of the battery, and a deterioration degree of the battery based on the quantity of change in the SOC of the battery. The processor calculates the total deterioration degree by multiplying each of the deterioration degrees by the corresponding contribution degree, and summing the values obtained by multiplication. The processor changes one or more of the contribution degrees to be used when the deterioration degrees are multiplied next time (for example, increases a contribution degree corresponding to a specific deterioration degree), for example, when the calculated total deterioration degree is large (when deterioration has progressed). Thus, it is possible to calculate the total deterioration degree which more accurately corresponds to the residual lifetime of the secondary battery. As a result, it is possible to provide the deterioration degree calculating apparatus for a battery which can accurately determine the lifetime of the secondary battery.

In the first aspect of the invention, the processor may calculate plural deterioration degrees based on the temperature of the battery, the charging/discharging current value, and the SOC of the battery. Thus, the deterioration degree can be accurately calculated based on the temperature of the battery, the charging/discharging current value of the battery, and the SOC of the battery that have large influences on the deterioration of the secondary battery, for example, by integrating the state quantities thereof with respect to time.

In the first aspect of the invention, the deterioration degree calculating apparatus may further include a generating device which generates, based on the calculated total deterioration degree, information concerning a limit on the use of the battery. Thus, in the case where the battery is mounted in a vehicle and the battery is used as a secondary battery for driving the vehicle, when the secondary battery severely deteriorates and the calculated total deterioration degree indicates that the end of the lifetime of the secondary battery has been reached, information for suppressing further deterioration is generated in order to prevent the vehicle from becoming unable to run using the secondary battery. For example, this information is used for limiting electric power input to the secondary battery and electric power output from the secondary battery, or limiting the usable range of the SOC of the battery to a small range. Thus, it is possible to avoid a situation where the secondary battery becomes unable to completely function and the vehicle stops before replacement of the secondary battery is performed.

In the first aspect of the invention, the deterioration degree calculating apparatus may further include a generating device which generates, based on the calculated total deterioration degree, information concerning a warranty on the battery. Thus, it is possible to set the warranty period to a period until the end of the lifetime of the secondary battery that is actually determined based on the total deterioration degree, while the warranty period is usually set based on elapsed time after the start of use or the like.

In the first aspect of the invention, the deterioration degree calculating apparatus may further include a remaining value generating device which generates, based on the calculated total deterioration degree, information concerning a remaining value of the battery. Thus, it is possible to determine the remaining value of the battery based on the total deterioration degree which indicates an actual deterioration degree, while the remaining value of the battery is usually determined based on elapsed time after the start of use, or the like.

In the first aspect of the invention, the battery may be a battery for driving a vehicle, which is mounted in the vehicle. Thus, it is possible to accurately calculate the actual lifetime of the battery for driving the vehicle based on the total deterioration degree thereof, and to perform replacement of the battery before the vehicle may become unable to run.

In the first aspect of the invention, the deterioration degree calculating apparatus may further include a remaining value generating device which generates, based on the calculated total deterioration degree, information concerning a remaining value of the vehicle.

In the first aspect of the invention, it is possible to determine the remaining value of the vehicle using the battery as a driving source based on the total deterioration degree which indicates the actual deterioration degree, while the remaining value of the vehicle is usually determined based on a running distance or elapsed years after the vehicle starts to run.

In the first aspect of the invention, the deterioration degree calculating apparatus may further include a deterioration degree storing device that stores the total deterioration degree. Furthermore, the deterioration degree storing device may hold the total deterioration degree even when power supply is interrupted.

A deterioration degree calculating method for a battery according to a second aspect of the invention includes a detecting step of detecting plural state quantities of a battery; a first calculating step of calculating plural deterioration degrees based on the detected plural state quantities; a storing step of storing contribution degrees each of which corresponds to each of the plural deterioration degrees; a second calculating step of calculating a total deterioration degree of the battery based on the deterioration degrees and the contribution degrees; and a third calculating step of calculating the contribution degrees based on the calculated total deterioration degree.

According to the second aspect of the invention, in the detecting step, for example, a temperature of the secondary battery, a charging/discharging current value of the battery, and a quantity of change in a state of charge (SOC) of the battery are detected. In the first calculating step, for example, a deterioration degree of the battery based on the temperature of the battery, a deterioration degree of the battery based on the charging/discharging value of the battery, and a deterioration degree of the battery based on the quantity of change in the SOC of the battery are calculated. In the second calculating step, the total deterioration degree of the battery is calculated by multiplying each of the deterioration degrees by the corresponding contribution degree stored in the storing step, and summing the values obtained by multiplication. In the third calculating step, one or more of the contribution degrees to be used when the deterioration degrees are multiplied next time are changed (for example, a contribution degree corresponding to a specific deterioration degree is increased), for example, when the calculated total deterioration degree is large (when deterioration has progressed). Thus, it is possible to calculate the total deterioration degree which more accurately corresponds to the residual lifetime of the secondary battery. As a result, it is possible to provide a deterioration degree calculating method for a battery which can accurately determine the lifetime of the secondary battery.

In the second aspect of the invention, the first calculating step may calculate plural deterioration degrees based on the temperature of the battery, the charging/discharging value of the battery, and the SOC of the battery. Thus, the deterioration degree can be accurately calculated based on the temperature of the battery, the charging/discharging current value of the battery, and the SOC of the battery that have large influences on the deterioration of the secondary battery, for example, by integrating the state quantities thereof with respect to time.

In the second aspect of the invention, the deterioration degree calculating method may further include a generating step of generating, based on the calculated total deterioration degree, information concerning a limit on the use of the battery. Thus, in the case where the battery is mounted in a vehicle, and the battery is used as a secondary battery for driving the vehicle, when the secondary battery severely deteriorates and the calculated total deterioration degree indicates that the end of the lifetime of the secondary battery has been reached, information for suppressing further deterioration is generated in order to prevent the vehicle from becoming unable to run using the secondary battery. For example, this information is used for limiting electric power input to and output from the secondary battery, or limiting the usable range of the SOC of the battery to a small range. Thus, it is possible to avoid a situation where the secondary battery becomes unable to completely function and the vehicle stops before replacement of the secondary battery is performed.

In the second aspect of the invention, the deterioration degree calculating method may include a generation step of generating, based on the calculated total deterioration degree, information concerning a warranty of the battery. Thus, it is possible to set the warranty period to a period until the end of the lifetime of the secondary battery that is actually determined based on the total deterioration degree, while the warranty period is usually set based on elapsed time after the start of use or the like.

In the second aspect of the invention, the deterioration degree calculating method may further include a remaining value generating step of generating, based on the calculated total deterioration degree, information concerning a remaining value of the battery. Thus, it is possible to determine the remaining value of the battery based on the total deterioration degree which indicates an actual deterioration degree, while the remaining value of the battery is usually determined based on elapsed time after the start of use, or the like.

In the second aspect of the invention, the battery may be a battery for driving a vehicle, which is mounted in the vehicle. Thus, it is possible to accurately calculate the actual lifetime of the battery for driving the vehicle based on the total deterioration degree thereof, and to perform replacement of the battery before the vehicle may become unable to run.

In the second aspect of the invention, the deterioration degree calculating method may further include a remaining value generating step of generating, based on the calculated total deterioration degree, information concerning a remaining value of the vehicle. Thus, it is possible to determine the remaining value of the vehicle using the battery as a driving source, based on the total deterioration degree which indicates the actual deterioration degree, while the remaining value of the vehicle is usually determined based on a running distance or elapsed years after the vehicle starts to run.

In the second aspect of the invention, the deterioration degree calculating method may further include a deterioration degree storing step of storing the total deterioration degree. Furthermore, the total deterioration degree may be held even when power supply is interrupted.

A deterioration degree calculating apparatus according to a third aspect of the invention includes detecting means for detecting plural state quantities of a battery; processing means for calculating plural deterioration degrees based on the detected plural state quantities; storing means for storing contribution degrees each of which corresponds to each of the deterioration degrees; the processing means calculating a total deterioration degree based on the deterioration degrees and the contribution degrees; and the processing means calculating the contribution degrees.

BRIEF DESCRIPTION OF THE DRAWINGS

The foregoing and further objects, features and advantages of the invention will become apparent from the following description of preferred embodiments with reference to the accompanying drawings, wherein-like numerals are used to represent like elements and wherein:

FIG. 4 is a diagram showing a relationship between a battery temperature and a lifetime coefficient $\gamma$;

FIG. 5 is a diagram showing a relationship between $\Delta$SOC and a lifetime coefficient $\delta$;

DETAILED DESCRIPTION OF THE PREFERRED EMBODIMENTS

Hereinafter, an embodiment of the invention will be described with reference to the accompanying drawings. In the following description, the same components are denoted by the same numerals. They have the same names and the same functions. Accordingly, detailed description thereof will not be repeated.

Hereinafter, a calculating apparatus will be described, which calculates a lifetime consumption coefficient indicating a deterioration degree of a secondary battery that supplies electric power to a device for driving a vehicle, such as a nickel-hydrogen battery. The application of the calculating apparatus according to the invention is not limited to the nickel-hydrogen battery. The calculating apparatus according to the invention can be applied also to an NiCd Battery or a lithium-ion battery.

Figure 1:
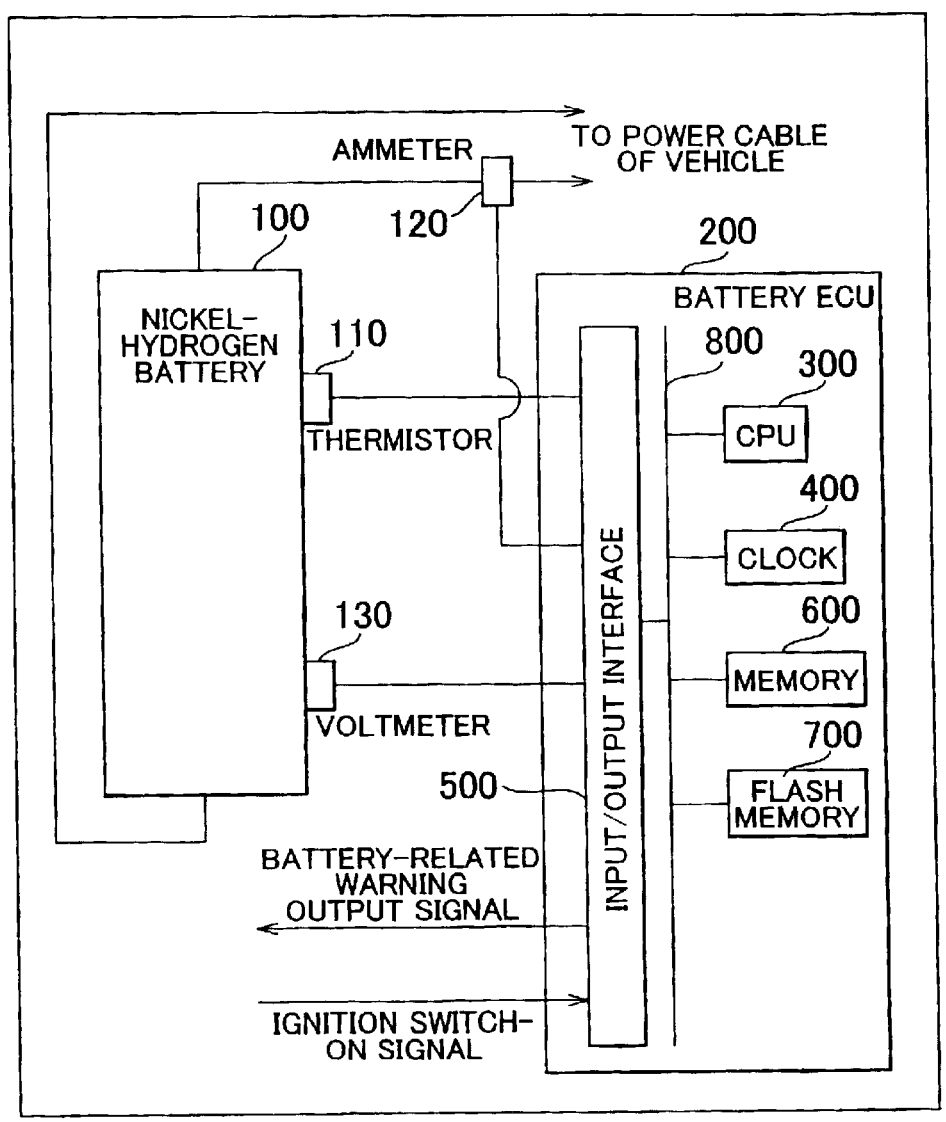
FIG. 1 is a block diagram showing control of a vehicle provided with a battery ECU according to an embodiment of the invention.

With reference to FIG. 1, a power unit of a vehicle will be described, which includes a battery electronic control unit (hereinafter referred to as ECU) 200 for realizing a deterioration degree calculating apparatus according to the embodiment of the invention. As shown in FIG. 1, the power unit of the vehicle includes a nickel-hydrogen battery 100 and a battery ECU 200. A thermistor 110 for measuring a temperature of the battery and a voltmeter 130 for measuring a voltage of the battery are attached to the nickel-hydrogen battery 100. An ammeter 120 for measuring charging/discharging current is attached to an input/output cable which connects the nickel-hydrogen battery 100 and a power cable of the vehicle. The battery ECU 200 includes an input/output interface 500, a central processing unit (hereinafter referred to as CPU) 300, a clock 400, a memory 600, and a flash memory 700. The input/output interface 500 is connected to the thermistor 110, the ammeter 120, the voltmeter 130, a battery-related warning output signal wire, and an ignition switch-on signal wire. The CPU 300 controls the battery ECU 200. The memory 600 and the flash memory 700 store various data.

A power source terminal of the nickel-hydrogen battery 100 is connected to the power cable of the vehicle, and supplies electric power to a motor for running the vehicle, auxiliaries, electrical components, and the like. The thermistor 110 detects the temperature of the nickel-hydrogen battery 100, and a signal indicating the temperature thereof is transmitted to the CPU via the input/output interface 500 of the battery ECU 200. The ammeter 120 detects a value of a charging/discharging current to/from the nickel-hydrogen battery 100, and the detected current value is transmitted to the CPU 300 via the input/output interface 500 of the battery ECU 200. An electric power value can be calculated by accumulating the current value for a given time. The voltmeter 130 detects a voltage value of the nickel-hydrogen battery 100, and the detected voltage value is transmitted to the CPU 300 via the input/output interface 500 of the battery ECU 200.

The battery ECU 200 detects the temperature of the nickel-hydrogen battery 100, the current value, and the voltage value at a time interval corresponding to a clock signal measured by the clock 400. The battery ECU 200 calculates a lifetime coefficient α, a lifetime coefficient β, a lifetime coefficient γ, and a lifetime coefficient δ based on the detected temperature of the nickel-hydrogen battery 100, the detected current value, the detected voltage value, and the like. The voltage value may be used for calculating the SOC and the like. An estimated lifetime consumption quantity A based on a parking time and the battery temperature, an estimated lifetime consumption quantity B based on an accumulated current value and the battery temperature, and an estimated lifetime consumption quantity C based on an accumulated SOC usable range are calculated, using the lifetime coefficients α, β, γ, δ.

The battery ECU 200 reads, from the memory 600, weighting coefficients a, b, c which correspond to the three estimated lifetime consumption quantities A, B, C, respectively. Then, the battery ECU 200 calculates a lifetime consumption coefficient L by multiplying the estimated lifetime consumption quantities A, B, C by the weighting coefficients a, b, c, respectively. The calculated lifetime consumption coefficient L is stored in the flash memory 700. This power unit in which the nickel-hydrogen battery 100 and the battery ECU 200 are integrated is on the market. The lifetime consumption coefficient L of the nickel-hydrogen battery 100 is semipermanently stored in the flash memory 700. Since the lifetime consumption coefficient L is stored in the flash memory 700, even if power supply to the battery ECU 200 is interrupted, the lifetime consumption coefficient L is not erased.

The battery ECU 200 calculates the weighting coefficient a, b, c which correspond to the three estimated lifetime consumption quantities A, B, C, respectively, based on the calculated lifetime consumption coefficient L. Then, the battery ECU 200 stores the weighting coefficients a, b, c in the memory 600.

Also, in the battery ECU 200, the input/output interface 500, the CPU 300, the clock 400, the memory 600, and the flash memory 700 are connected via an internal bus 800, and data communication can be performed among them.

Figure 2:
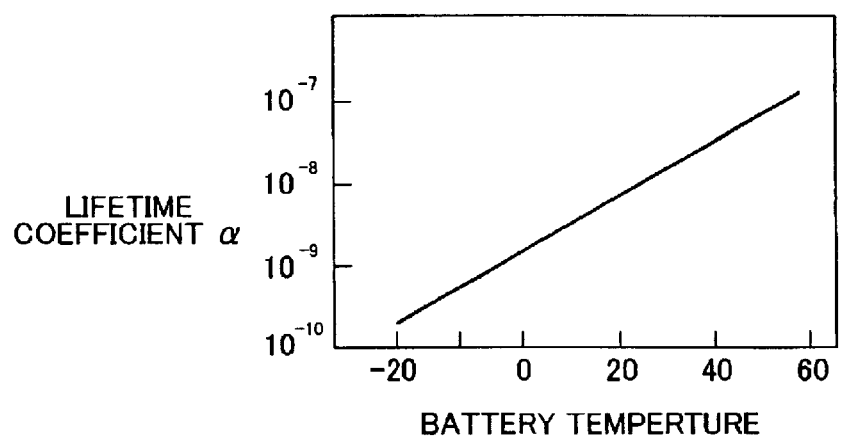
FIG. 2 is a diagram showing a relationship between a battery temperature and a lifetime coefficient $\alpha$.

A relationship between the battery temperature and the lifetime coefficient α, which is stored in the memory 600 of the battery ECU 200, will be described with reference to FIG. 2. In fact, the relationship between the battery temperature and the lifetime coefficient α is stored in the memory 600 in the form of a map. FIG. 2 shows the relationship between the battery temperature and the lifetime coefficient α in the form of a graph. As shown in FIG. 2, the lifetime coefficient a increases with an increase in the battery temperature. FIG. 2 is applied to the case where the vehicle is stopped. As the battery temperature becomes higher, the deterioration progresses more quickly. In the graph in FIG. 2, the relationship between the battery temperature and the lifetime coefficient α is indicated by a straight line that does not have an inflection point. However, the invention is not limited to this. The relationship therebetween may be indicated by a curve that has an inflection point.

Figure 3:
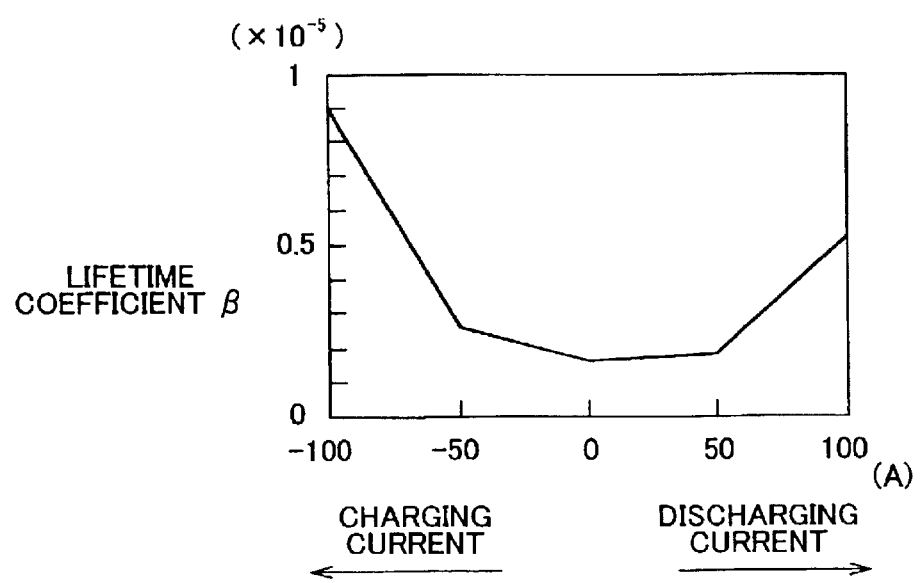
FIG. 3 is a diagram showing a relationship between a charging/discharging current value and a lifetime coefficient $\beta$.

A relationship between the charging/discharging current value and the lifetime coefficient β, which is stored in the memory 600 of the battery ECU 200, will be described with reference to FIG. 3. In fact, the relationship between the charging/discharging current value and the lifetime coefficient β is stored in the memory 600 in the form of a map. As shown in FIG. 3, in the case where the charging current or the discharging current is equal to or larger than a predetermined value, the lifetime coefficient β increases with an increase in the charging current or the discharging current. Also, the lifetime coefficient β increases at a larger rate when the discharging current increases than when the charging current increases.

A relationship between the battery temperature and the lifetime coefficient γ, which is stored in the memory 600 of the battery ECU 200, will be described with reference to FIG. 4. In fact, the relationship between the battery temperature and the lifetime coefficient γ is stored in the memory 600 in the form of a map. As shown in FIG. 4, the lifetime coefficient γ increases with an increase in the battery temperature. FIG. 4 is applied to the case where the vehicle is running. Accordingly, in FIG. 4, a horizontal axis indicates the battery temperature while the vehicle is running.

A relationship between the ΔSOC and the lifetime coefficient δ, which is stored in the memory 600 of the battery ECU 200, will be described with reference to FIG. 5. In fact, the relationship between the ΔSOC and the lifetime coefficient δ is stored in the memory 600 in the form of a map. The lifetime coefficient δ increases with an increase in the ΔSOC. In addition, a vertical axis also indicates the number of lifetime cycles.

Figure 6:
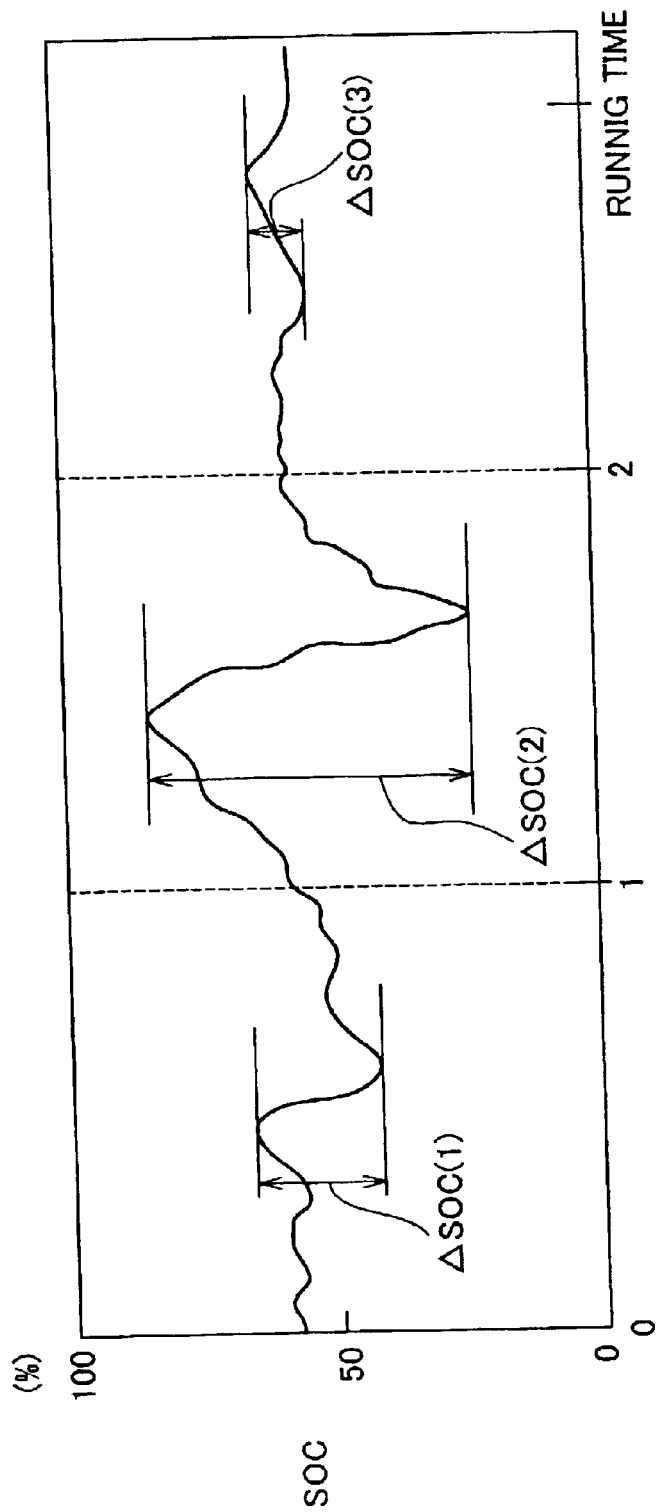
FIG. 6 is a diagram showing a relationship between a running time of the vehicle and SOC.

A method of calculating the ΔSOC indicated by a horizontal axis in FIG. 5, with reference to FIG. 6. In FIG. 6, the horizontal axis indicates running time of the vehicle, and the vertical axis indicates the SOC. As shown in FIG. 6, the level of the SOC increases and decreases while the vehicle is running. For example, ΔSOC is defined as a difference between the highest SOC and the lowest SOC during a running period of one hour. As shown in FIG. 6, ΔSOC (1), ΔSOC (2), and ΔSOC (3) are calculated in this manner. The lifetime coefficient δ shown in FIG. 5 is calculated by calculating the ΔSOC as shown in FIG. 6.

Figure 7:
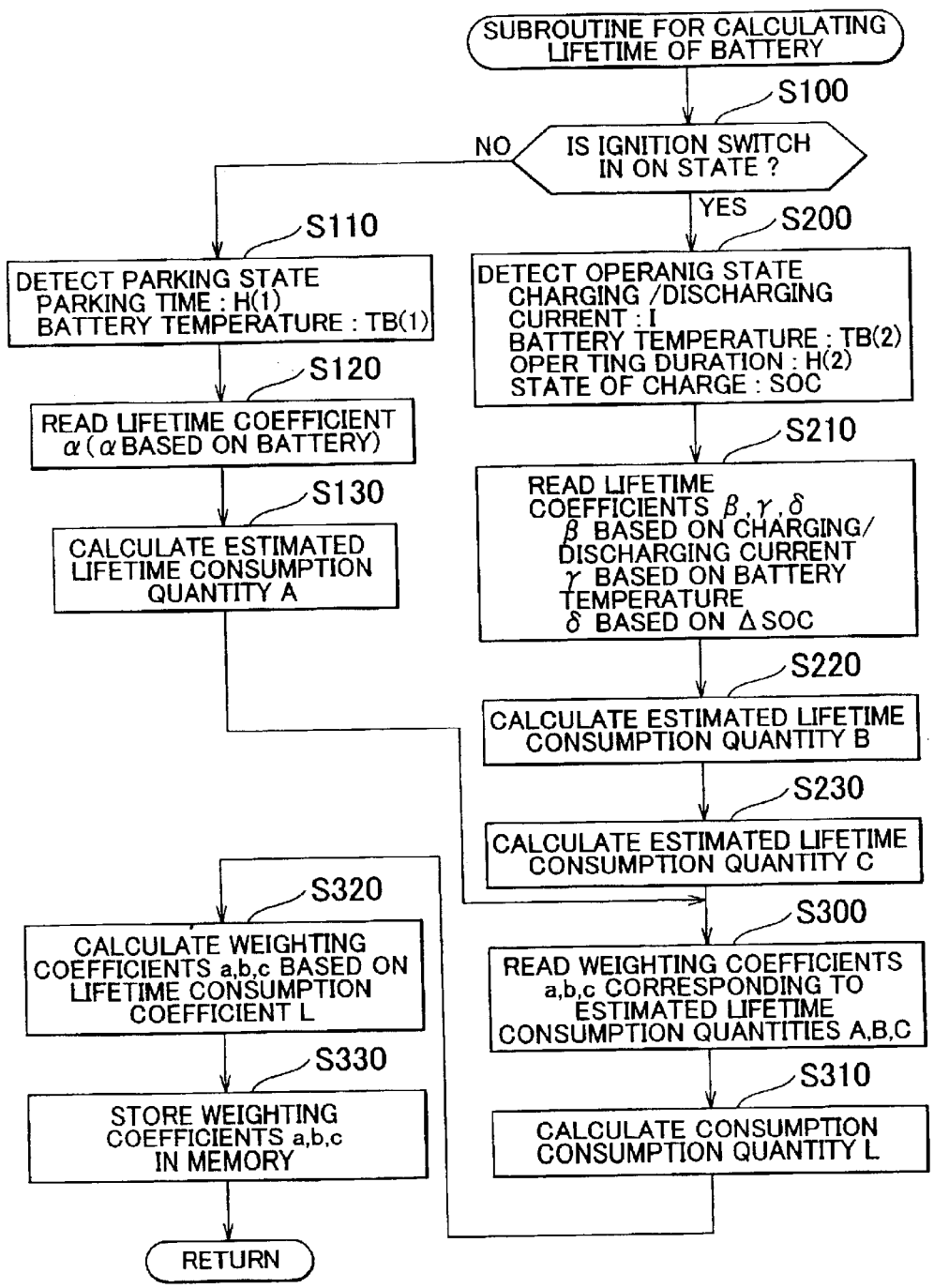
FIG. 7 is a flowchart showing a control structure of a program performed by the battery ECU according to the embodiment of the invention.

A control structure of a program performed by the CPU 300 of the battery ECU 200 according to the embodiment will be described with reference to FIG. 7.

In step S100, the CPU 300 determines whether or not the ignition switch is in the ON state. This determination is made based on the ignition switch-on signal which is input through the input/output interface 500. If the ignition switch is in the ON state (YES in step S100), the process proceeds to step S200. If the ignition switch is not in the ON state (NO in step S100), the process proceeds to step S110.

In step S110, the CPU 300 detects the state quantities while the vehicle is being parked. More particularly, a parking time H (1), and a battery temperature TB (1) are detected. In step S120, the CPU 300 reads the lifetime coefficient α. The lifetime coefficient α is a coefficient based on the battery temperature TB (1). Also, the relationship between the battery temperature TB (1) and the lifetime coefficient α is indicated in the graph in FIG. 4.

In step S130, the CPU 300 calculates the estimated lifetime consumption quantity A. At this time, the estimated lifetime consumption quantity A is calculated according to the following equation. $A=\int\{\alpha(TB(1))\times H\}dH$. In other words, the estimated lifetime consumption quantity A is calculated by multiplying the lifetime coefficient α determined based on the battery temperature by the parking time, and integrating the resultant value with respect to time. Then, the process proceeds to step S300. In step S200, the CPU 300 detects the state quantities while the vehicle is running. At this time, a charging/discharging current I, the battery temperature TB (2), the operating duration H (2), and the SOC indicating the state of charge are detected.

In step S210, the CPU 300 reads the lifetime coefficients β, γ, δ from the memory 600. The lifetime coefficient β which is read at this time is a coefficient based on the charging/discharging current of the nickel-hydrogen battery 100. The lifetime coefficient γ is a coefficient based on the battery temperature of the nickel-hydrogen battery 100, and the lifetime coefficient δ is a coefficient based on the ΔSOC of the nickel-hydrogen battery 100.

In step S220, the CPU 300 calculates the estimated lifetime consumption quantity B. At this time, the estimated lifetime consumption quantity B is calculated according to the following equation. $B=\int\{\beta(I)\times\gamma(TB(2))\times|I|\times H\}dH$. In other words, the estimated lifetime consumption quantity B is calculated by multiplying the lifetime coefficient β based on the charging/discharging current by the lifetime coefficient γ determined based on the battery temperature, the absolute value of the charging/discharging current, and the running time, and by integrating the resultant value with respect to time.

In step S230, the CPU 300 calculates the estimated lifetime consumption quantity C. At this time, the estimated lifetime consumption quantity C is calculated according to the following equation. $C=\int\{\delta(\Delta SOC)\times\gamma(TB(2))\times H\}dH$. In other words, the estimated lifetime consumption quantity C is calculated by multiplying the lifetime coefficient δ determined based on ΔSOC by the lifetime coefficient γ determined based on the battery temperature and the running time, and by integrating the resultant value with respect to time.

In step S300, the CPU 300 reads, from the memory 600, the weighting coefficients a, b, c corresponding to the estimated lifetime consumption quantities A, B, C. In step S310, the CPU 300 calculates the lifetime consumption coefficient L. At this time, the lifetime consumption coefficient L is calculated according to the following equation. $L=a\times A+b\times B+c\times C$.

Figure 8:
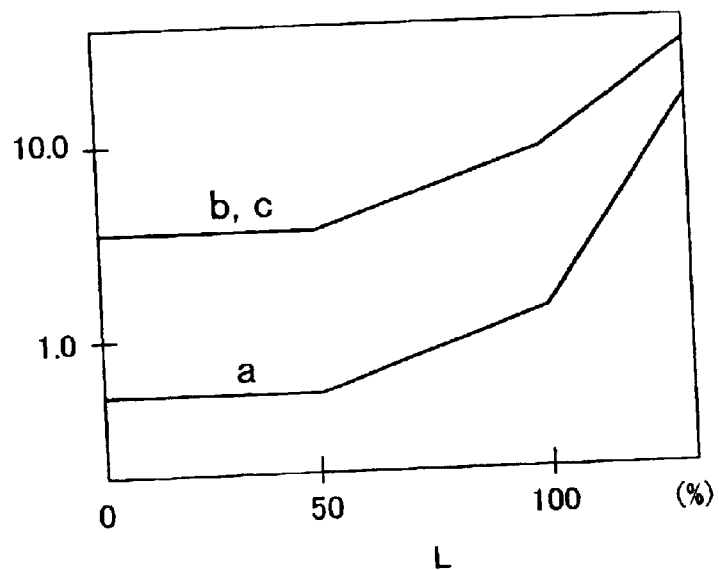
FIG. 8 is a diagram showing a relationship between a lifetime consumption coefficient L and weighting coefficients.

In step S320, the CPU 300 calculates the weighting coefficients a, b, c based on the lifetime consumption coefficient L. At this time, the weighting coefficients a, b, c are calculated based on the lifetime consumption coefficient L in accordance with the relationship shown in FIG. 8. As shown in FIG. 8, as the lifetime consumption coefficient L increases, a difference between the weighting coefficient a and the weighting coefficients b, c decreases. In step S330, the CPU 300 stores the weighting coefficients a, b, c in the memory 600.

The operation of a deterioration degree calculating apparatus according to the embodiment will be described, which has the aforementioned structure and operates according to the aforementioned flowchart.

When a subroutine for calculating the lifetime of a battery is started, it is determined whether or not the ignition switch is in the ON state (step S100). If the ignition switch is not in the ON state (No in step S100), it is determined that the vehicle is being parked, and the state quantities while the vehicle is being parked are detected (step S110). At this time, the parking time H (1) and the battery temperature TB (1) are detected. The lifetime coefficient α based on the battery temperature is read from the memory 600 (step S120). The estimated lifetime consumption quantity A is calculated using the read lifetime coefficient α and the parking time (step S130).

In the case where the vehicle is running, it is determined that the ignition switch is in the ON state (YES in step S100), and state quantities while the vehicle is running are detected (step S200). At this time, the charging/discharging current, the battery temperature, the operating duration, and the SOC (state of charge) are detected.

The lifetime coefficients β, γ, δ are read from the memory 600 (step S210). The estimated lifetime consumption quantity B is calculated based on the lifetime coefficient β determined based on the charging/discharging current, the lifetime coefficient γ determined based on the battery temperature, the absolute value of the charging/discharging current value, and the operating duration (step S220). The estimated lifetime consumption quantity C is calculated based on the lifetime coefficient δ determined based on ΔSOC, the lifetime coefficient γ determined based on the battery temperature, and the operating duration.

The weighting coefficients a, b, c corresponding to the estimated lifetime consumption quantities A, B, C are read from the memory 600 (step S300). The lifetime consumption coefficient L is calculated using the estimated lifetime consumption quantities A, B, C and the weighting coefficients a, b, c which correspond to the estimated lifetime consumption quantities A, B, C, respectively (step S310).

The weighting coefficients a, b, c are calculated based on the calculated lifetime consumption coefficient L. At this time, the weighting coefficients a, b, c are calculated based on the data stored in the memory 600 as shown in FIG. 8. In step S330, the weighting coefficients a, b, c are stored in the memory 600.

Figure 9:
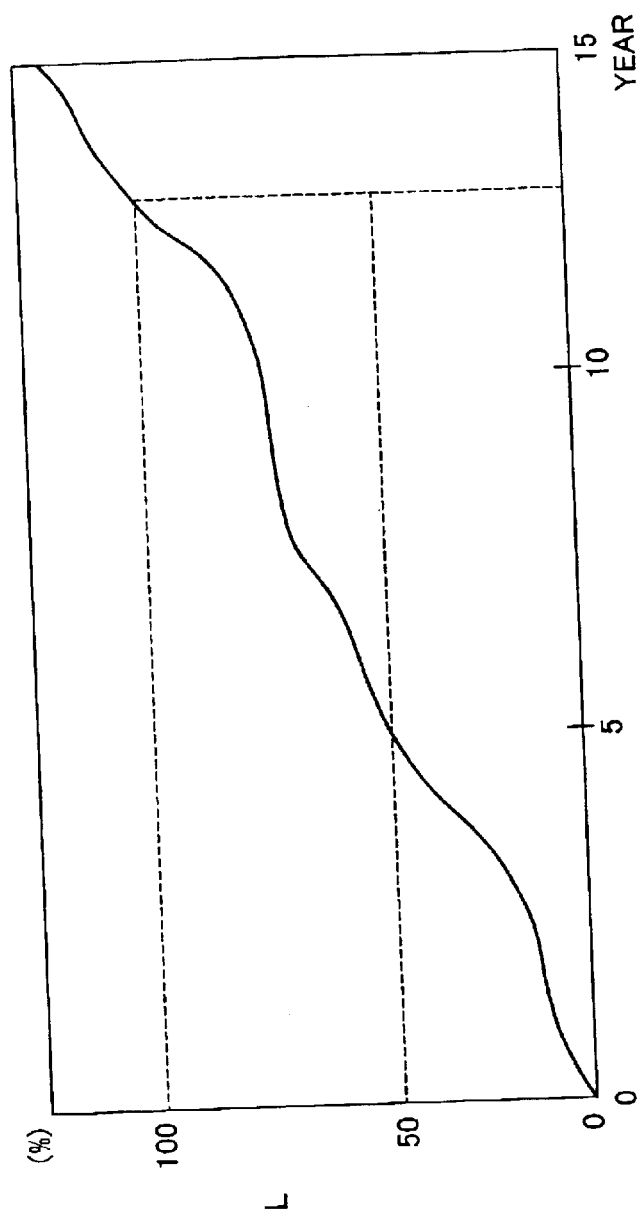
FIG. 9 is a diagram showing a change in the lifetime consumption coefficient L.
Figure 10:
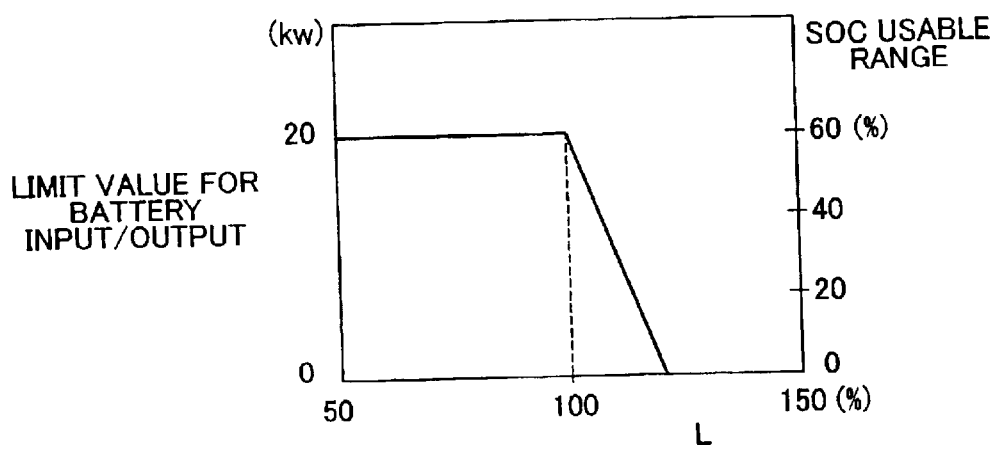
FIG. 10 is a diagram showing a relationship among the lifetime consumption coefficient L, a limit value for battery input/output, and an SOC usable range.

The lifetime consumption coefficient L, which is calculated by the aforementioned operation, increases with an increase in the number of elapsed years after the vehicle starts to run, as shown in FIG. 9. When the lifetime consumption coefficient L becomes 100% in FIG. 9, the nickel-hydrogen battery 100 is at the end of the lifetime that is estimated based on the characteristics thereof. As shown in FIG. 9, the nickel-hydrogen battery 100 reaches the end of the lifetime (the lifetime consumption coefficient L becomes 100%) when approximately 13 years has elapsed after start of use. When the lifetime consumption coefficient L exceeds 100%, a user of the vehicle is notified by a display that the end of the lifetime has been reached. Also, when the lifetime consumption coefficient L exceeds 100%, the electric power that is input/output to/from the nickel-hydrogen battery 100 is limited, or an SOC usable range is reduced so that the vehicle can run without failure using such a deteriorated nickel-hydrogen battery 100. Thus, even when the lifetime consumption coefficient L exceeds 100%, the battery can be prevented from becoming unable to function suddenly, and accordingly the vehicle can be prevented from becoming unable to run.

Figure 11:
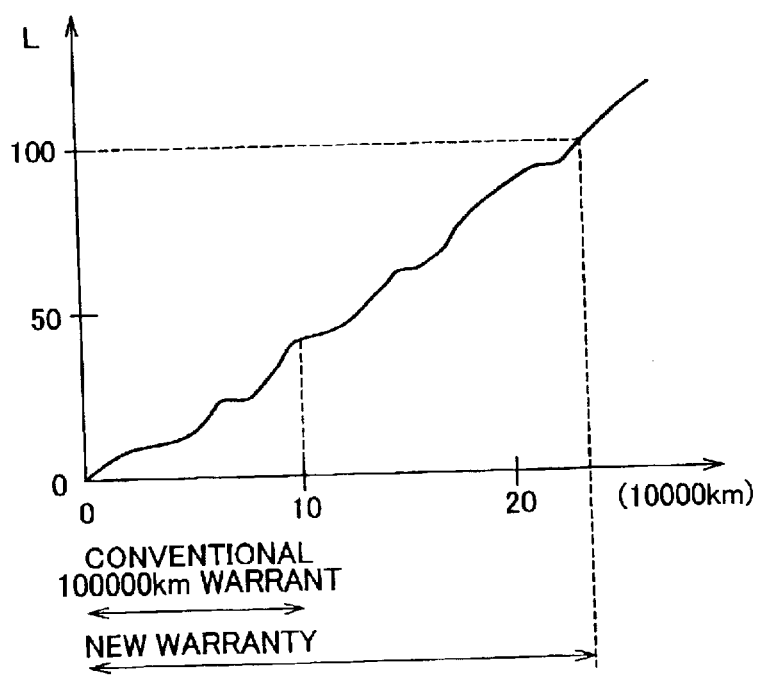
FIG. 11 is a diagram showing a relationship between the running distance of the vehicle and the lifetime consumption coefficient L.
Figure 12:
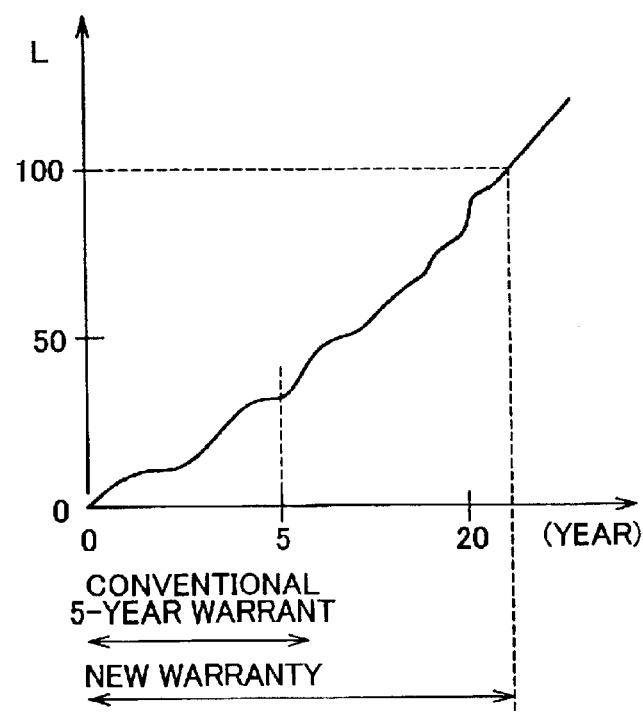
FIG. 12 is a diagram showing a relationship between the running distance of the vehicle and the lifetime consumption coefficient L.

A manufacturer's warranty on the nickel-hydrogen battery 100 will be described using the lifetime consumption coefficient L calculated by the aforementioned operation. FIG. 11 shows a change in the lifetime consumption coefficient L with respect to the running distance of the vehicle. FIG. 12 shows a change in the lifetime consumption coefficient L with respect to the number of elapsed years after the vehicle starts to run. Conventionally, the nickel-hydrogen battery 100 is guaranteed by a manufacturer until the running distance of the vehicle reaches 100000 km, as shown in FIG. 11. However, according to the deterioration degree calculating apparatus according to the invention, the period of the manufacturer's warranty on the nickel-hydrogen battery 100 can be extended until the lifetime consumption coefficient L becomes 100% (that is, the nickel-hydrogen battery 100 reaches the end of the lifetime). Also, conventionally, the nickel-hydrogen battery 100 is guaranteed by a manufacturer until 5 years have elapsed after the vehicle starts to run, as shown in FIG. 12. However, according to the deterioration degree calculating apparatus according to the invention, the period of the manufacturer's warranty can be extended until the lifetime consumption coefficient L becomes 100% (the nickel-hydrogen 100 reaches the end of the lifetime).

Figure 13:
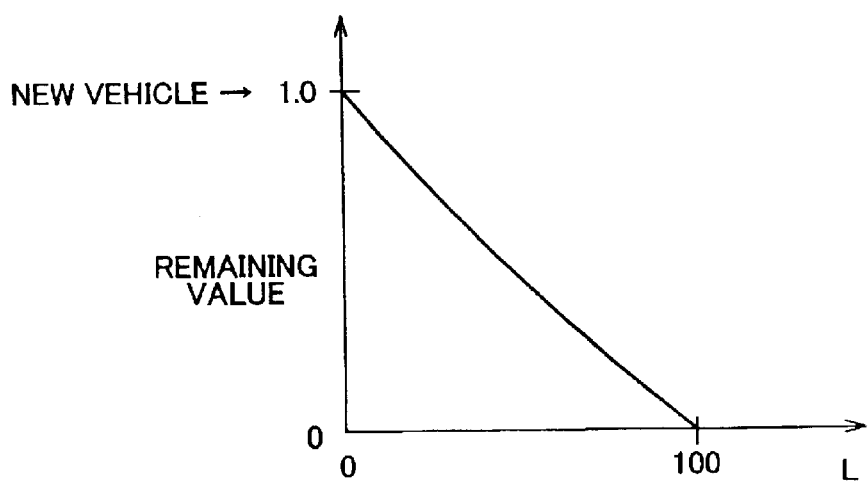
FIG. 13 is a diagram showing a relationship between a remaining value of the vehicle and the lifetime consumption coefficient L.

FIG. 13 shows a relationship between the lifetime consumption coefficient L and a remaining value of the vehicle or the nickel-hydrogen battery 100. The remaining value decreases with an increase in the lifetime consumption coefficient L. The remaining value of the vehicle or the nickel-hydrogen battery 100 based on the lifetime consumption coefficient L can be calculated using the relationship shown in FIG. 13.

Further, the lifetime consumption coefficient L thus calculated is stored in the flash memory 700. Therefore, even when power supply to the battery ECU 200 is interrupted, the lifetime consumption coefficient L which is stored is not erased. Also, even when the used battery ECU 200 and the nickel-hydrogen battery 100 are sold as one unit, the residual lifetime of the nickel-hydrogen battery 100 can be accurately calculated with reference to the lifetime consumption coefficient L stored in the flash memory 700.

Thus, according to the deterioration degree calculating apparatus for a battery according to the embodiment of the invention, the temperature of the nickel-hydrogen battery, the charging/discharging current value, the change quantity in the SOC, and the like are detected, and the estimated lifetime consumption quantity A based on the battery temperature, the estimated lifetime consumption quantity B based on the charging/discharging current value, and the estimated lifetime consumption quantity C based on the change in the SOC are calculated. Each of the three estimated lifetime consumption quantities thus calculated is multiplied by the corresponding weighting coefficient, whereby the lifetime consumption coefficient L of the entire nickel-hydrogen battery is calculated. At this time, the weighting coefficients by which the estimated lifetime consumption quantities are multiplied change based on the lifetime consumption coefficient L. As a result, it is possible to calculate the lifetime consumption coefficient for determining the lifetime of the nickel-hydrogen battery that is closer to the actual lifetime. Consequently, the lifetime of the nickel-hydrogen battery can be accurately determined.

Thus, the embodiment of the invention that has been disclosed in the specification is to be considered in all respects as illustrative and not restrictive. The technical scope of the invention is defined by claims, and all changes which come within the meaning and range of equivalency of the claims are therefore intended to be embraced therein.

What is claimed is:

1. A deterioration degree calculating apparatus for a battery, comprising:
   a detector that detects plural state quantities of the battery;
   a processor that calculates plural deterioration degrees based on the detected plural state quantities; and
   a storing device that stores contribution degrees each of which corresponds to each of the plural deterioration degrees;
   wherein the processor calculates a total deterioration degree of the battery based on the deterioration degrees and the contribution degrees, and
   the processor calculates the contribution degrees based on the calculated total deterioration degree.

2. The deterioration degree calculating apparatus according to claim 1, wherein the processor calculates the plural deterioration degrees based on a temperature of the battery, a charging/discharging current value of the battery, and a state of charge of the battery.

3. The deterioration degree calculating apparatus according to claim 1, further comprising a generating device that generates, based on the calculated total deterioration degree, information concerning a limit on use of the battery.

4. The deterioration degree calculating apparatus according to claim 1, further comprising a generating device that generates, based on the calculated total deterioration degree, information concerning a warranty on the battery.

5. The deterioration degree calculating apparatus according to claim 1, further comprising a remaining value generating device that generates, based on the calculated total deterioration degree, information concerning a remaining value of the battery.

6. The deterioration degree calculating apparatus according to claim 1, wherein the battery is a battery for driving a vehicle, which is mounted in the vehicle.

7. The deterioration degree calculating apparatus according to claim 6, further comprising a remaining value generating device that generates, based on the calculated total deterioration degree, information concerning a remaining value of the vehicle.

8. The deterioration degree calculating apparatus according to claim 1, further comprising a deterioration degree storing device that stores the total deterioration degree.

9. The deterioration degree calculating apparatus according to claim 8, wherein the deterioration degree storing device holds the total deterioration degree even when power supply is interrupted.

10. A deterioration degree calculating method for a battery, comprising:
    a first detecting step of detecting plural state quantities of the battery;
    a first calculating step of calculating plural deterioration degrees based on the detected plural state quantities;
    a storing step of storing the contribution degrees each of which corresponds to each of the plural deterioration degrees;
    a second detecting step of calculating a total deterioration degree of the battery based on the deterioration degrees and the contribution degrees; and
    a third calculating step of calculating the contribution degrees based on the calculated total deterioration degree.

11. The deterioration degree calculating method according to claim 10, wherein the first calculating step calculates plural deterioration degrees based on a temperature of the battery, a charging/discharging value of the battery, and a state of charge of the battery.

12. The deterioration degree calculating method according to claim 10, further comprising a generating step of generating, based on the calculated total deterioration degree, information concerning a limit on use of the battery.

13. The deterioration degree calculating method according to claim 10, further comprising a generating step of generating, based on the calculated total deterioration degree, information concerning a warranty on the battery.

14. The deterioration degree calculating method according to claim 10, further comprising a remaining value generating step of generating, based on the calculated total deterioration degree, information concerning a remaining value of the battery.

15. The deterioration degree calculating method according to claim 10, wherein the battery is a battery for driving a vehicle, which is mounted in the vehicle.

16. The deterioration degree calculating method according to claim 15, further comprising a remaining value generating step of generating, based on the calculated total deterioration degree, information concerning a remaining value of the vehicle.

17. The deterioration degree calculating method according to claim 10, further comprising a deterioration degree storing step of storing the total deterioration degree.

18. The deterioration degree calculating method according to claim 17, wherein the total deterioration degree is held even when power supply is interrupted.

19. A deterioration degree calculating apparatus for a battery, comprising:

detecting means for detecting plural state quantities of the battery;

processing means for calculating plural deterioration degrees based on the detected plural state quantities; and storing means for storing contribution degrees each of which corresponds to each of the plural deterioration degrees;

wherein the processing means calculates a total deterioration degree of the battery base on the deterioration degrees and the contribution degrees, and the processing means calculates the contribution degrees based on the calculated total deterioration degree.

* * * * *